United States Patent [19]

Trask et al.

[11] Patent Number: 5,474,956
[45] Date of Patent: Dec. 12, 1995

[54] METHOD OF FABRICATING METALLIZED SUBSTRATES USING AN ORGANIC ETCH BLOCK LAYER

[75] Inventors: Philip A. Trask, Laguna Hills; Vincent A. Pillai, Irvine, both of Calif.

[73] Assignee: Hughes Aircraft Company, Los Angeles, Calif.

[21] Appl. No.: 403,610

[22] Filed: Mar. 14, 1995

[51] Int. Cl.⁶ ........................ H01L 21/268; H01L 21/312
[52] U.S. Cl. .......................... 437/173; 437/235; 437/228; 437/243; 437/978; 148/DIG. 43; 427/409; 427/388.2
[58] Field of Search ..................................... 437/231, 235, 437/947, 978, 962, 228, 243, 173; 148/DIG. 43, DIG. 103, DIG. 106, DIG. 25; 156/661.11; 427/272, 276, 282, 259, 379, 388.2, 388.3, 385.5, 407.1, 409

[56] References Cited

U.S. PATENT DOCUMENTS

| | | | |
|---|---|---|---|
| 4,523,976 | 6/1985 | Bukhman | 156/659.11 |
| 4,606,998 | 8/1986 | Clodgo et al. | 156/659.11 |
| 5,023,204 | 6/1991 | Adachi et al. | 437/231 |
| 5,034,091 | 7/1991 | Trask et al. | 156/643.1 |
| 5,114,757 | 5/1992 | Linde et al. | 437/235 |
| 5,194,928 | 3/1993 | Cronin et al. | 437/235 |
| 5,242,864 | 9/1993 | Fassberg et al. | 437/228 |

FOREIGN PATENT DOCUMENTS

| | | | |
|---|---|---|---|
| 62-149136 | 7/1987 | Japan | 437/947 |
| 63-86550 | 4/1988 | Japan | . |
| 63-226931 | 9/1988 | Japan | 437/947 |
| 2-202030 | 8/1990 | Japan | . |

*Primary Examiner*—Brian E. Hearn
*Assistant Examiner*—Leon Radomsky
*Attorney, Agent, or Firm*—M. E. Lachman; M. W. Sales; W. K. Denson-Low

[57] ABSTRACT

A method of patterning a metallized substrate using a thin partially cured etch block layer. In accordance with the method, a substrate is provided and a layer of metal, such as aluminum, is deposited on the substrate. A thin layer of organic dielectric material, such as polyimide, is deposited over the layer of metal. The thin layer of organic dielectric material is deposited to a thickness on the order one micron, for example, which is thin enough to have etch resistance when acting as an etch block layer for subsequent wet etch patterning of the layer of metal, and thick enough to have no pinhole defects. The deposited thin organic dielectric layer is then partially cured. The underlying layer of metal is then patterned and wet etched using the partially cured thin organic dielectric material as the blocking layer. An additional thick layer of organic dielectric material is then deposited or coated over the patterned layer of metal and partially cured organic dielectric layer. The partially cured organic dielectric layer and the additional thick organic dielectric material are then simultaneously full cured. Upon curing, the partially cured organic dielectric layer conforms to the etched underlying layer of metal.

10 Claims, 2 Drawing Sheets

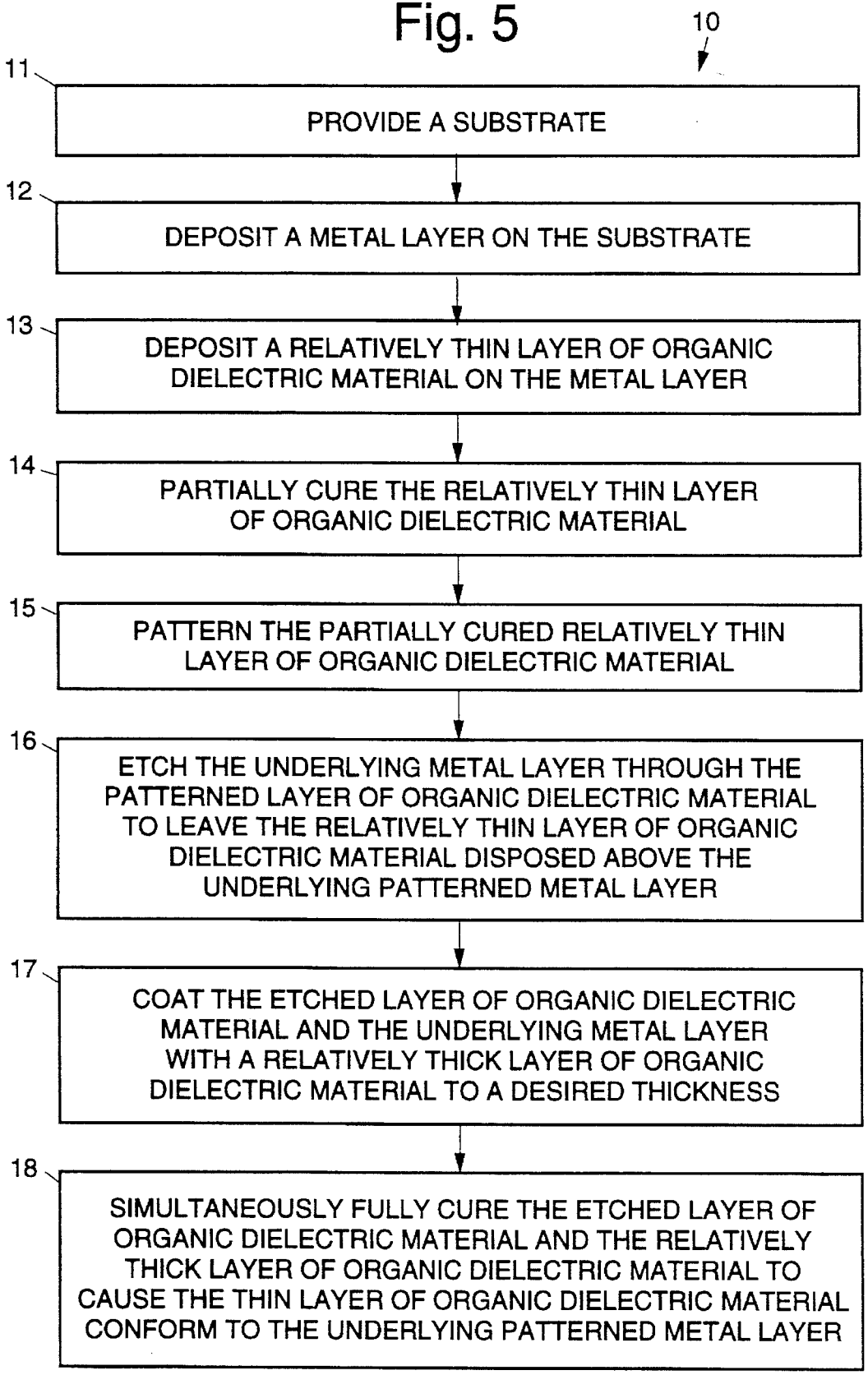

METHOD OF FABRICATING METALLIZED SUBSTRATES USING AN ORGANIC ETCH BLOCK LAYER

BACKGROUND

The present invention relates generally integrated circuit processing methods, and more particularly, to a method of fabricating metallized substrates by forming an etch block layer.

Conventional etch blocking layer materials, such as photoresist materials, for example, are typically removed after etching. The assignee of the present invention has previously developed a method of using an etch blocking organic layer and subsequent wet etch procedure which leaves the etch block layer in place. This invention is disclosed in U.S. patent application Ser. No. 08/119,925, filed Sep. 10, 1993, entitled "Phase Mask Laser Fabrication of Electronic Interconnect Structures".

The invention disclosed in this patent application uses phase mask laser machining to fabricate a high density fine patent feature electrical interconnection structure, such as semiconductor wafers, multichip modules, and microelectro-mechanical devices. The phase mask laser machining procedures delineate metal conductor patterns. The conductor patterns are fabricated using a phase mask laser patterned dielectric layer as a conductor wet etch masking layer, or by subtractively removing metal using holographic phase mask laser micromachining.

Using this invention, a first layer of dielectric material is formed on a substrate, a metal layer is formed on the first layer of dielectric material, and a second layer of dielectric material is formed on the metal layer. A phase mask is disposed above the second layer of dielectric material that has a predefined phase pattern therein defining a metal conductor pattern that corresponds to an interconnect structure. The second layer of dielectric material is then processed using the phase mask to form the interconnect structure. The etch mask formed by the second layer of dielectric material need not be removed after etching of the metal, and is made thin enough to not disturb the overall thickness relationship of the interlayer dielectric layer (an additional deposited dielectric layer), whereby the capacitance of the interlayer dielectric is maintained at its desired value.

However, an overhanging ledge is formed above the metal layer and it is possible that this could cause air entrapment and the formation of potentially damaging blisters when the interlayer dielectric layer is deposited. Accordingly, it is an objective of the present invention to provide for an improved method of forming an etch block layer for use in fabricating metallized integrated circuit substrates, and the like, that eliminates these potential problems.

SUMMARY OF THE INVENTION

To meet the above and other objectives, in accordance with the principles of the present invention, a layer of metal is deposited on a substrate, and a relatively thin layer of organic dielectric material is deposited over the layer of metal. The thin layer of organic dielectric material is deposited to a thickness that is thin enough to have etch resistance when acting as an etch block layer for subsequent etch patterning of the underlying layer of metal, but thick enough to have no pinhole defects. The thin layer of organic dielectric material is typically deposited to a thickness on the order one micron, for example. The deposited thin layer of organic dielectric material is then dried or partially cured. The amount of curing depends upon the pattern etching environment and chemistry. The underlying layer of metal is then etched using a wet or dry reactive ion etching procedure with the thin organic dielectric material as a blocking layer. Because the thin layer of organic dielectric material is dried or only partially cured, it conforms to the etched underlying layer of metal upon subsequent coating with an additional relatively thick layer organic dielectric material and full curing of both layers.

More particularly, the very thin, dried or partially cured organic dielectric layer is left after etching of the underlying layer of metal, and forms an overhanging ledge. The overhanging ledge could possibly trap air upon subsequent coating with additional organic dielectric material unless it deforms and becomes coformal over the edge of the etched layer of metal. By depositing the thin layer of organic material to a very minimal thickness (approximately one micron) and by purposely not fully curing (polymerizing) it, the thin layer of organic dielectric material becomes more plastic and thus deforms so as to conform to the edge of the underlying etched layer of metal upon full curing. This prevents air entrapment and blisters from forming when the thick layer of organic dielectric material is deposited over the etch block layer and both layers are fully cured.

The present invention may be used in fabricating deposition-type multichip module (MCM-D) large panel high density multilayer interconnect (HDMI®) substrates, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 5 is a flow diagram detailing the process flow of the present method.

DETAILED DESCRIPTION

Figure 1:
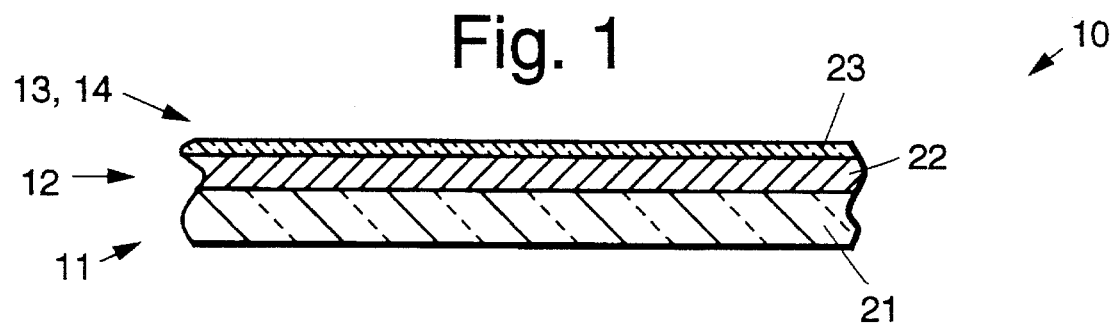
FIGS. 1–4 illustrate processing steps of a method of forming an etch block layer in accordance with the principles of the present invention.

Referring to the drawing figures, FIGS. 1–4 show processing steps of a method 10 of fabricating a metallized substrate 21 using an organic dielectric etch block layer 23 in accordance with the principles of the present invention. Reference is also made to FIG. 5, which is a flow diagram illustrating the process flow of the present method 10.

Referring to FIG. 1, a substrate 21 is provided (step 11), and a metal layer 22 is deposited (step 12) on the substrate 21. The substrate 21 typically comprises a base layer, which may be formed of metal with a dielectric layer disposed thereon, silicon, polyimide, or flexible substrate material, for example. The underlying metal layer 22 typically comprises aluminum, for example. A relatively thin layer of organic dielectric material 23 is deposited (step 13) over the previously deposited underlying metal layer 22. The relatively thin layer of organic dielectric material 23 is deposited to a thickness on the order of one micron, for example. The relatively thin layer of organic dielectric material 23 is dried (step 14) but is not fully cured. The amount of curing depends upon the pattern etching environment and chemistry that are employed. By way of example, the thin layer of organic dielectric material 23 is cured to the point where it is insoluable in wet etching fluid that is used. This may be on the order of heating the structure for 0.5 hours at a temperature of 250 degrees Celsius, for example.

Figure 2:
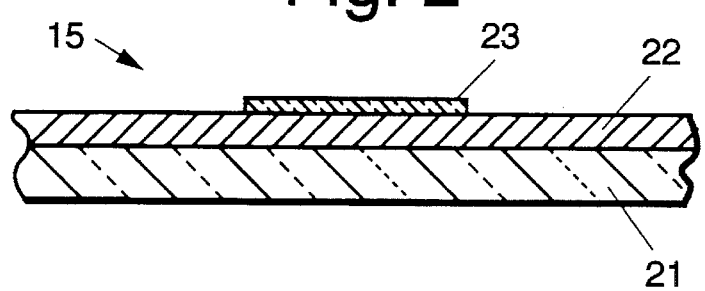

Referring to FIG. 2, the relatively thin layer of organic dielectric material 23 is patterned (step 15) in a conventional manner, such as by using an excimer laser direct ablation procedure, or a photolithographic procedure, for example. The patterning step 15 removes portions of the relatively thin layer of organic dielectric material 23 and leaves the organic dielectric material 23 where metal is desired. The underlying metal layer 22 is then etched (step 16) through the patterned thin layer of organic dielectric material 23, typically using a wet etching procedure or a dry reactive ion etching procedure.

Figure 3:
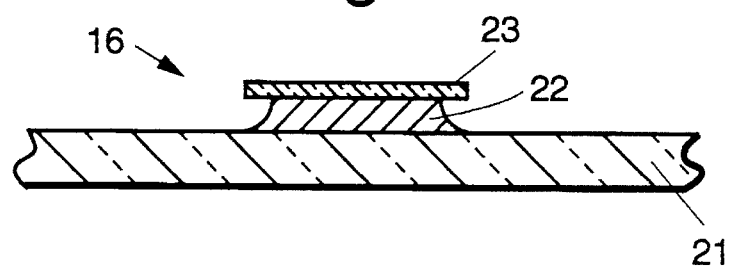

Referring to FIG. 3, the etching step 16 leaves the relatively thin layer of organic dielectric material 23 in place above the underlying metal layer 22. The thin layer of organic dielectric material 23 is undercut by the etching step 16.

Figure 4:
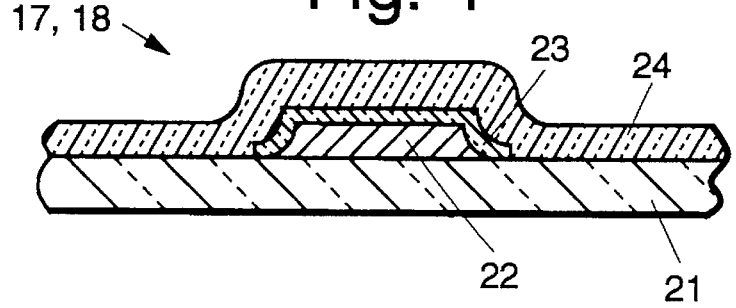

Referring to FIG. 4, the etched thin layer of organic dielectric material 23 and the underlying metal layer 22 are then coated with a relatively thick layer of organic dielectric material 24 to a desired thickness (step 17). The desired thickness of the relatively thick layer of organic dielectric material 24 is typically on the order of 9–10 microns, for example. The etched thin layer of organic dielectric material 23 and the relatively thick layer of organic dielectric material 24 are then simultaneously fully cured (step 18), to cause the thin layer of organic dielectric material 23 conform to the underlying patterned metal layer 22. This curing step 18 eliminates the formation of air bubbles or blisters.

Thus, there has been described a new and improved method of patterning a metallized substrate using an organic dielectric etch block layer. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of fabricating a metallized substrate comprising the steps of:

providing a substrate;

depositing a metal layer on the substrate;

depositing a relatively thin layer of organic dielectric material on the metal layer;

partially curing the relatively thin layer of organic dielectric material;

patterning the partially cured relatively thin layer of organic dielectric;

etching the underlying metal layer through the patterned layer of organic dielectric material to leave the relatively thin layer of organic dielectric material disposed above the underlying patterned metal layer;

coating the etched layer of organic dielectric material and the underlying metal layer with a relatively thick layer of organic dielectric material to a desired thickness; and simultaneously fully curing the etched layer of organic dielectric material and the relatively thick layer of organic dielectric material to cause the thin layer of organic dielectric material conform to the underlying patterned metal layer.

2. The method of claim 1 wherein the step of depositing a metal layer on the substrate comprises depositing an aluminum layer on the substrate.

3. The method of claim 1 wherein the step of depositing a relatively thin layer of organic dielectric material comprises depositing the layer of organic dielectric material to a thickness of about one micron.

4. The method of claim 1 wherein the step of patterning the partially cured relatively thin layer of organic dielectric material comprises the step of patterning the layer using a photolithographic procedure.

5. The method of claim 1 wherein the step of patterning the partially cured relatively thin layer of organic dielectric material comprises the step of patterning the layer using an excimer laser direct ablation procedure.

6. The method of claim 1 wherein the step of etching the underlying metal layer through the patterned layer of organic dielectric material comprises using a wet etching procedure.

7. The method of claim 6 wherein the step of etching the underlying metal layer through the patterned layer of organic dielectric material undercuts the thin layer of organic dielectric material.

8. The method of claim 1 wherein the step of etching the underlying metal layer through the patterned layer of organic dielectric material comprises using a reactive ion etching procedure.

9. The method of claim 1 wherein desired thickness of the relatively thick layer of organic dielectric material is about 9–10 microns.

10. The method of claim 6 wherein the step of partially curing the relatively thin layer of organic dielectric material comprises heating the material for about 0.5 hours at a temperature of about 250 degrees Celsius.

\* \* \* \* \*